United States Patent [19]
Chen

[11] Patent Number: 6,083,766
[45] Date of Patent: Jul. 4, 2000

[54] PACKAGING METHOD OF THIN FILM PASSIVE COMPONENTS ON SILICON CHIP

[75] Inventor: Lung-hsin Chen, Hsinchu, Taiwan

[73] Assignee: Viking Tech Corporation, Hsinchu, Taiwan

[21] Appl. No.: 09/399,365

[22] Filed: Sep. 20, 1999

[30]    Foreign Application Priority Data

Jul. 1, 1999 [TW] Taiwan ................................. 88111316

[51] Int. Cl.⁷ .................................................. H01L 21/66
[52] U.S. Cl. .............................................. 438/15; 438/800
[58] Field of Search ............................. 438/14, 388, 381, 438/455, 758, 800

[56] References Cited

U.S. PATENT DOCUMENTS 4,012,579  3/1977  Fox et al. .................................. 174/52
5,355,014  10/1994  Rao et al. ................................ 257/533

Primary Examiner—Charles Bowers
Assistant Examiner—Craig Thompson
Attorney, Agent, or Firm—Bacon & Thomas, PLLC

[57]                ABSTRACT

The present invention relates to a packaging method of thin film passive components on silicon chip, which employs ceramic or glass substrate to be mounted with the silicon chip so as to improve the mechanical strength of the components, and to a method of using thick film packaging technology to package the component. The cycle time of packaging is saved and the production cost is low.

8 Claims, 5 Drawing Sheets

PACKAGING METHOD OF THIN FILM PASSIVE COMPONENTS ON SILICON CHIP

BACKGROUND OF THE INVENTION

1. Field of the Invention

The present invention generally relates to a packaging method of thin film passive components on silicon chip, which employs ceramic or glass substrate to be mounted with the silicon chip so as to improve the mechanical strength of the component, and to a method of using thick film packaging technology to package the component.

2. Background of the Invention

In recent years, due to wide application of SMT technology, passive components are made into chips. Currently, thin film method and thick film method are essentially used to form passive components in the form of chips.

One such conventional thin film packaging method to form RC integrated component is disclosed in U.S. Pat. No. 5,355,014, wherein conventional semiconductor fabrication technology is used to form a RC network having Schottky diode on a silicon substrate.

Generally, after the formation of the thin film passive components, an insulating passivation layer is used to cover the components. Then, the conductive layer is exposed to provide a plurality of connecting points for soldering via photolithography and etching process. Then, conventional IC packaging method is used to package the products. Generally, this conventional packaging process includes the following steps: wafer backside polishing, wafer saw, die attaching, wire bonding, molding, marking, de junk/dam bar, lead cutting/forming, and packaging.

The thin film passive components fabricated by above-mentioned method has advantage of smaller size and higher yield. But, the cost is much higher than the similar thick film passive component. This is due to the fact that the process of packaging required by the thin film passive components is very complicated and the material cost is high.

If conventional thick film packaging method is employed, a passivation layer using screen printing, marking, cutting, termination, electroplating, and taping are required. The materials cost and process cost used in this method are less and the cycle time is shorter, thus, the total cost of packaging is lower.

However, the thin film passive components fabricated on the silicone substrates cannot be packaged by using such a method. This is because the silicon material does not possess sufficient mechanical strength and can be easily damaged in the fabrication process.

Accordingly, it is an object of the present invention to provide a packaging method of thin film passive components on a silicon chip, and employing a ceramic or glass substrate to bond with the component so as to improve the mechanical strength of the component. The present method employs thick film packaging method to package the component and solves the drawbacks described as above. The present invention also combines advantages of thin film process; such as better performance, smaller chip size with high yield, and thick film process; such as low cost packaging method.

SUMMARY OF THE INVENTION

The object of the present invention is to provide a packaging method of thin film passive components on a silicon chip, and employing a ceramic or glass substrate to bond with the component so as to improve the mechanical strength of the component, then, thick film packaging method is employed to package the component.

An aspect of the present invention is to provide the packaging method as follows:

(a) using silicon as the substrate and forming a thin film passive components with conventional semiconductor method, wherein the passive component can be a single functional components such as L, R and C component, or integrated components, e.g. RC, LC and LRC, etc, or R, C, RC and RCD network;

(b) forming a passivation layer by using conventional screen printing method and proceeding with marking, wafer backside polishing, and cutting in order to form a plurality of component chips;

(c) employing a ceramic or glass substrate which is conventionally used for thick film passive components to proceed the processes of first cutting and second cutting in order to form an appropriate size;

(d) coating an adhesive onto the surface of the ceramic or glass substrate obtained in (c);

(e) adhering the back of the silicone chips with the ceramic or glass substrate which is coated with the adhesive under an appropriate temperature and pressure so that they can be joined together; and (f) providing termination, electroplating and taping by thick film packaging method to the passive component to obtain product of thin film passive component.

In accordance with the present invention, the thin film passive component has a miniaturized size, the yield is high and the cost of package is low.

BRIEF DESCRIPTION OF THE DRAWINGS

The foregoing and other objects, features and advantages of the invention will be apparent from the following more particular description of preferred embodiment of the invention, as illustrated in the accompanying drawings.

DETAILED DESCRIPTION OF THE PREFERRED EMBODIMENT

Figure 1:
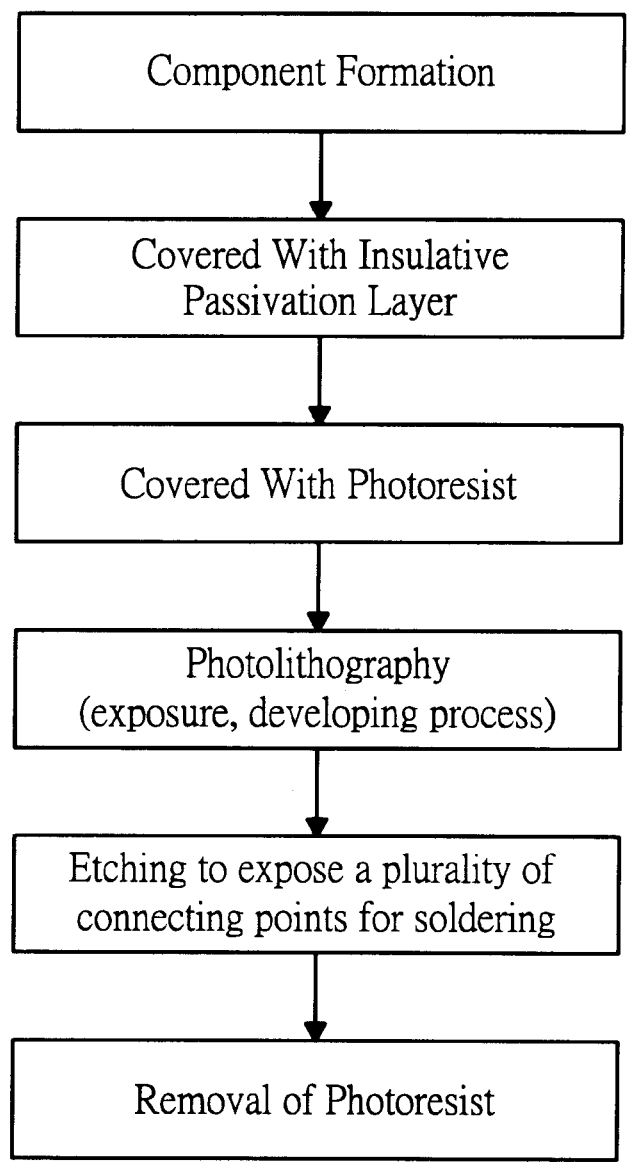
FIG. 1 is a flow chart showing a conventional fabrication steps of a passivation layer for RC thin film passive components on a silicon chip.
Figure 2:
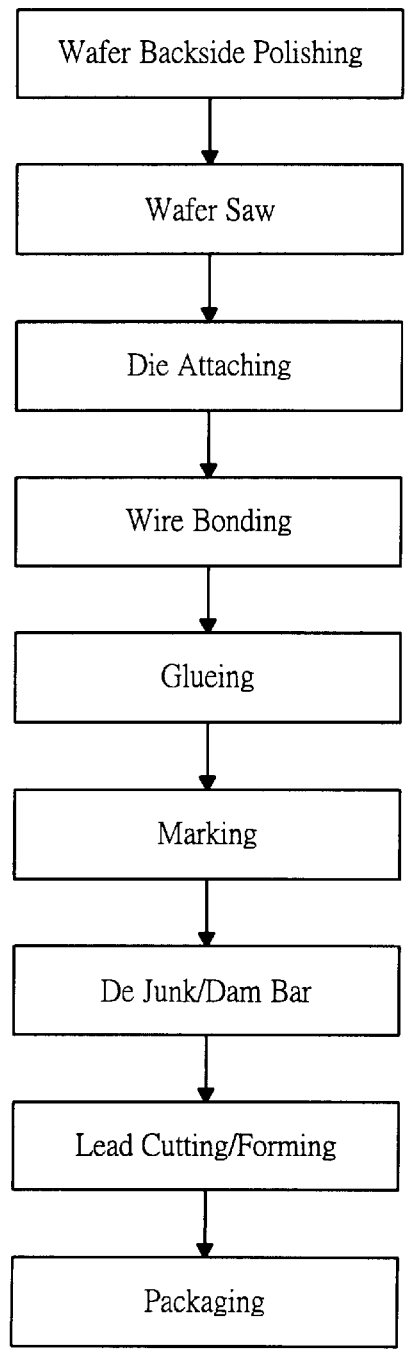
FIG. 2 is a flow chart showing conventional packaging steps for the thin film passive component on a silicone chip.

Referring to the drawings, FIGS. 1 and 2 show two flow charts illustrating a conventional fabrication steps of a passivation layer for RC thin film passive components on a silicon chip and packaging steps for the thin film passive components respectively.

Figure 3:
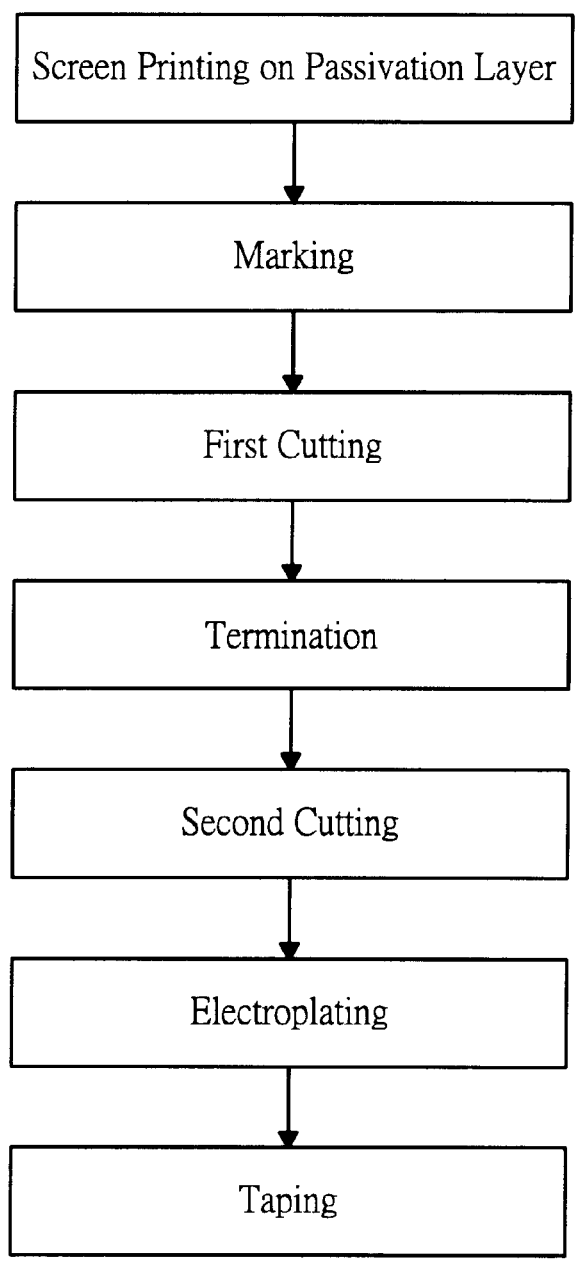
FIG. 3 is a flow chart showing a conventional fabrication steps for passivation layer and packaging of a thick film resistor.

FIG. 3 is a flow chart showing conventional fabrication steps for passivation layer and packaging of a thick film resistor.

Figure 4:
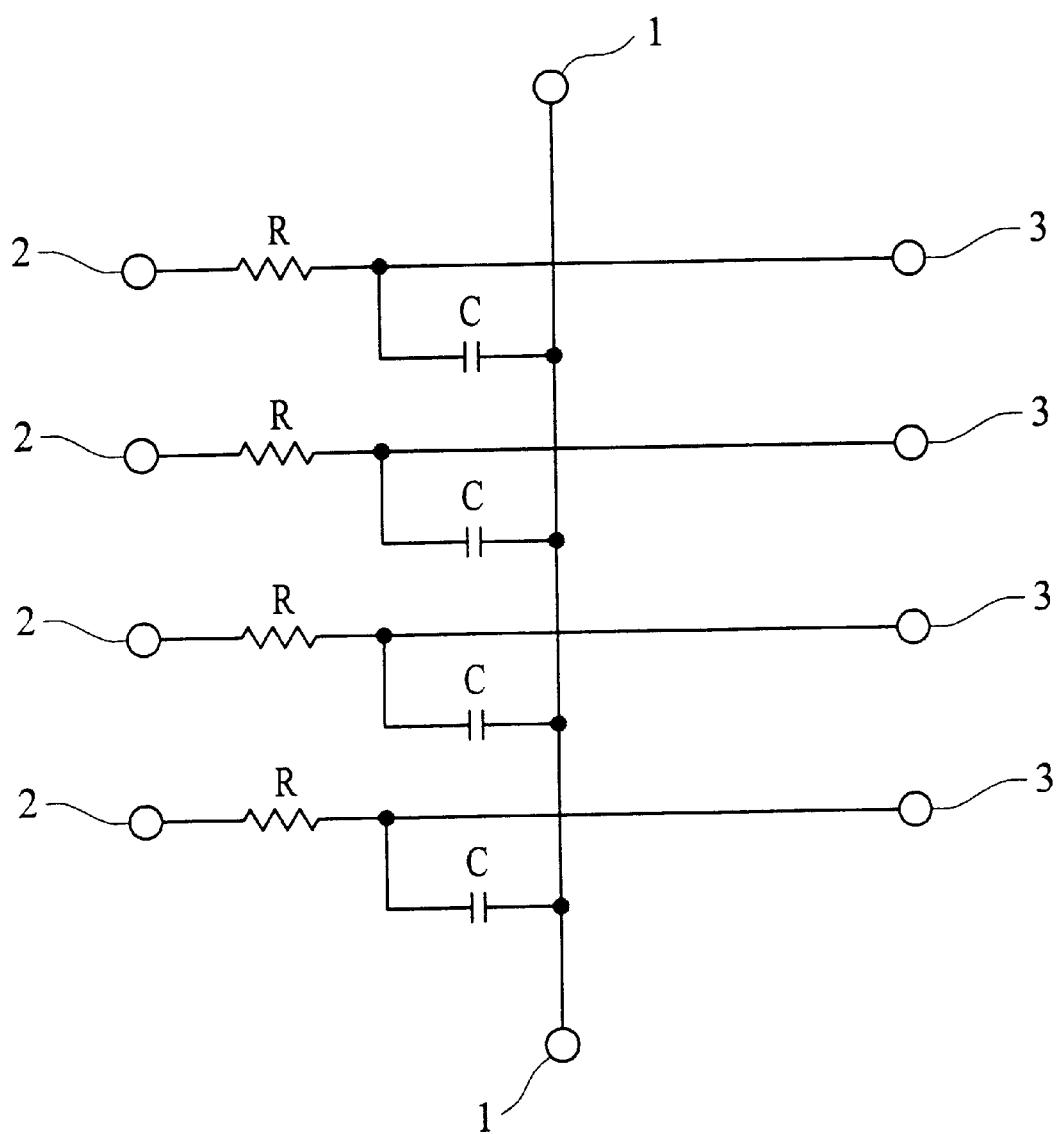
FIG. 4 is a schematic of RC thin film passive components in accordance with the present invention.

FIG. 4 is a schematic of RC thin film passive components in accordance with the present invention. As shown in FIG. 4, an L-shaped circuit consists of four circuit branches each having a resistor R in series connection with a capacitor C, nodes 1, 2 and 3 being respectively the ground terminal, a first electrode terminal and a second electrode terminal.

Figure 5A:
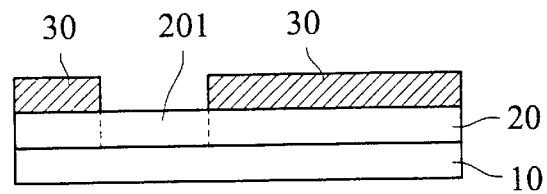
FIGS. 5A to 5E show the fabrication steps of the passivation layer and the packaging of the RC thin film passive components in accordance with the present invention.

FIGS. 5A to 5E show the fabrication steps of the passivation layer and the packaging of the RC thin film passive components in accordance with the present invention. As shown in FIG. 5A, a oxidizing silicon chip 10 available in the market is used as a substrate and a resistor layer 20 of thickness 200 Å to 2,000 Å is formed on the surface of the substrate by the method of sputter deposition or vapor deposition. The materials used can be TaNx, TaAlx or NiCr. Next, on the resistor layer 20, a first metallic conductive layer 30 of thickness 500 Å to 3,000 Å is formed by sputter deposition or vapor deposition. After that, by using photolithography and etching technologies, the metallic conductive layer 30 is etched to obtain a pattern for the first metallic conductive layer 30, wherein numeral 201 denotes an exposed resistor region. Next, a photo mask on the resistor region 201 is used to proceed with the photolithography and etching in order to form the required resistor pattern. In the present application, the resistor pattern thus formed is a linear resistor R.

Next, the entire surface is deposited a dielectric layer 40 of thickness about 340 Å to 3000 Å, using sputtering deposition or CVD method, as a dielectric of the capacitor. The material used is $Ta_2O_5$, $SiO_2$ or $Al_2O_3$. Then, the dielectric region 401 of the capacitor is etched by using photolithography or etching technology.

Figure 5B:
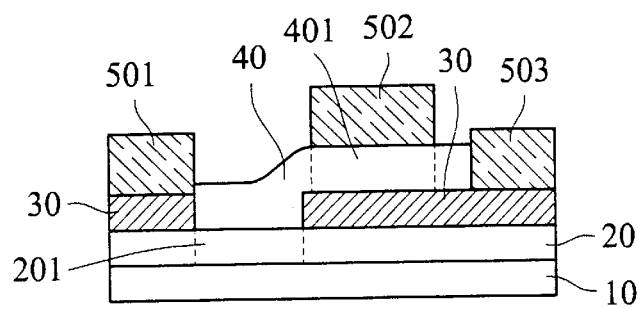

Next, the entire surface is deposited a second metallic conductive layer 50 by sputtering deposition or vapor deposition technology. Material with high conductivity such as Al, Cu and Ti/Au are used. Then, by photolithography and etching method, a pattern is formed as shown in FIG. 5B, wherein the region 501 corresponds to the first electrode terminal, the region 502 corresponds to the ground terminal, the region 503 corresponds to the second electrode terminal. The regions 502, 30 and the dielectric region 401 constitute the capacitor. Then, annealing treatment is employed for 20 minutes at a temperature of 400° C. to 500° C. to eliminate the stress therein.

At this instance, the individual resistor, capacitor, ground terminal, the first electrode terminal, the second electrode terminal and the wiring thereof are formed. Next, laser trimming technology is employed to trim the resistance of the chip to the required accuracy.

Figure 5C:
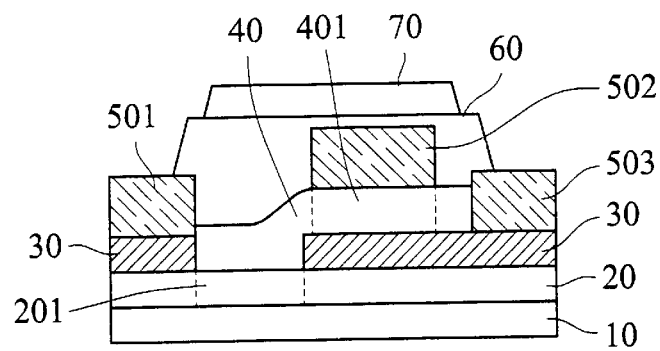

Then, electrically measure the resistor and the capacitor of the chip. Next, the thick film screen printing method is employed on the chip to fabricate a passivation layer and to proceed to the packaging process. As shown in FIG. 5C, by employing screen printing technology, a passivation layer 60 formed by resin material is printed on the chip surface such that the whole surface is covered by the passivation layer 60 other than the two ground terminals, four first electrodes and four second electrodes, and then proceed to a drying process. The two ground terminals correspond to node 1 in FIG. 2, the four first electrode terminals correspond to node 2 in FIG. 2, and the four second electrode terminals correspond to node 3 in FIG. 2. All these terminals are the lead-out terminals of the chip.

Next, using screen-printing method to print marking 70 indicating the parameters of the component on the passivation layer 60. The marking 70 is then undergone a drying process at a low temperature of about 200° C. After the marking 70 is dried, polish the back of the silicone substrate until a thickness of 0.2 mm to 0.35 mm is obtained. Then, proceed with cutting process.

Then, a ceramic or glass substrate used in the thick film and passive component is employed and is proceeded to a first cutting and a second cutting until an appropriate size and shape of substrate is obtained. In accordance with the preferred embodiment of the present invention, the ceramic or the glass substrate is cut into stripe in the first cutting process, and after the second cutting process, a required shape and size suitable for each RC array of each chip is obtained. Next, on the surface of the ceramic or glass substrate, an adhesive is coated. This adhesive is a kind of heat insulation material containing epoxycomposition. The method of coating includes printing, dot-gluing and transfer printing.

Figure 5D:
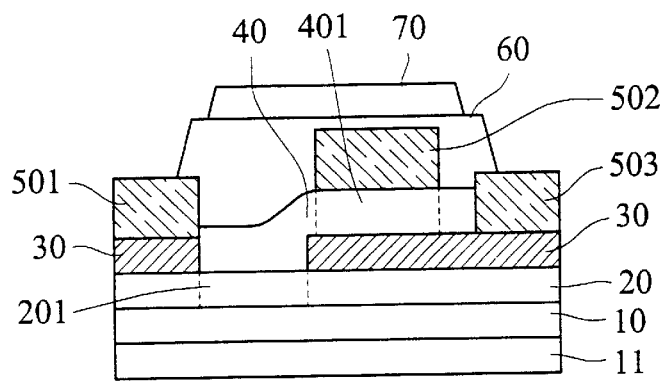

Next, as shown in FIG. 5D, under an appropriate temperature, time and adhesion pressure, the back of the chip is adhered to the surface of the ceramic or glass substrate 11 coated with the adhesive so that both components are joined to each other. The drying temperature of the adhesive is about 200° C., the time of drying is controlled within 5 minutes to 1 hour, and the adhesive pressure exerted is about 10 g to 350 g per unit area.

Next, by using thin film packaging method, the passive component is proceeded to silver electrode painting, electroplating, and roll-packaging steps to complete the packaging process, and thin film passive components are obtained. These steps are described as below.

Figure 5E:
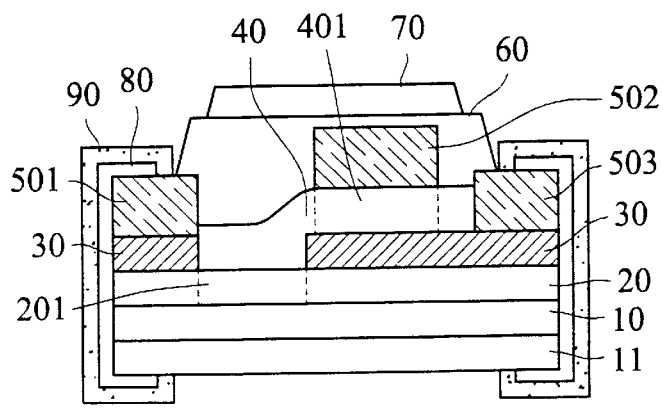

As shown in FIG. 5E, there is shown the termination process to fabricate a terminal electrode 80. The terminal electrode 80 essentially contains silver. The terminal electrode is connected to the lead terminal of the chip, and is extended to the bottom of the chip from the surface of the chip via the respective lateral sides. Next, it proceeds to a temperature below 260° C. to process the hardening treatment. Then, a layer of metal 90 is electroplated on the terminal electrodes, for instance, a layer of Cu/Ni/SnPb or Ni/Sn/Pb so as to obtain the soldering properties favorable to the subsequent SMT process. Accordingly, the L-shaped type of RC array is obtained.

Finally, the fabricated product is proceeded to a full inspection of resistor and capacitor properties, and then packaged.

The above-described preferred embodiment is a packaging method of an L-shaped RC thin film passive component, including the formation of wiring, passivation layer and packaging. Other types of passive components, either is a single function component, such as L, R, C, component, or an integrated component, such as RC, LC, LRC, or R, RC, RCD network, their fabrication of passivation layer and packaging process are similar to the L-shaped integrated RC component, and the only difference is the formation of pattern in the respective fabrication steps.

While the invention has been disclosed and described with reference to a specific embodiment, it will be apparent that variations and modification may be made therein, and it is therefore intended in the following claims to cover each such variation and modification as falls within the true spirit and scope of the invention.

What is claimed is:

1. A packaging method of thin film passive components on a silicon chip comprising the steps of:
   (a) forming an oxidized silicon substrate;
   (b) forming thin film passive components on the substrate including the sub-steps of:
      (b-1) forming a resistor layer and a first metallic conductive layer in sequence on the substrate by sputter deposition or vapor deposition technology and forming a resistor pattern on the resistor layer by photolithography and etching technologies, and forming a pattern for the two electrodes of the resistor on the first metallic conductive layer;

(b-2) forming a dielectric layer on the first metallic conductive layer by sputter deposition or CVD technology and forming a dielectric layer pattern by photolithography and etching technologies; and (b-3) forming a second metallic conductive layer on the dielectric layer by sputter deposition or vapor deposition and forming a second metallic conductive layer pattern by photolithography and etching technologies;

(c) forming a passivation layer by screen printing, and processing marking, polishing, and cutting to form a plurality of chips;

(d) forming an appropriate shape of a ceramic substrate used in the thick film passive component by a first cutting and a second cutting;

(e) coating an adhesive on the surface of the ceramic substrate;

(f) adhering the silicone chips onto the surface of the ceramic which is coated with the adhesive under an appropriate temperature and pressure;

(g) packaging by the method of thick film packaging, comprising the steps of
  (g-1) forming terminations and drying same;
  (g-2) electroplating the electrode;
  (g-3) testing the electrical characteristics of the formed integrated RC component; and
  (g-4) packaging all the obtained RC components.

2. A packaging method of thin film passive components on silicon chip as set forth in claim 1, wherein after the formation of said second metallic conductive layer, said plurality of chips are annealed to eliminate the stress therein; laser trimming technology is used to trim the resistance value; and electrical properties of the resistors and capacitors of said plurality of chips are measured.

3. A packaging method of thin film passive components on silicon chip as set forth in claim 1, wherein said ceramic substrate includes $Al_2O_3$ or AlN.

4. A packaging method of thin film passive components on silicon chip as set forth in claim 1, wherein said adhesive is a insulative thermal-conductive material containing epoxy, and the method of coating is selected from printing, dot-gluing or transfer printing.

5. A packaging method of thin film passive components on a silicon chip comprising the steps of:
  (a) forming an oxidized silicon substrate;
  (b) forming thin film passive components on the substrate including the sub-steps of:

(b-1) forming a resistor layer and a first metallic conductive layer in sequence on the substrate by sputter deposition or vapor deposition technology and forming a resistor pattern on the resistor layer by photolithography and etching technologies, and forming a pattern for the two electrodes of the resistor on the first metallic conductive layer;

(b-2) forming a dielectric layer on the first metallic conductive layer by sputter deposition or CVD technology and forming a dielectric layer pattern by photolithography and etching technologies; and (b-3) forming a second metallic conductive layer on the dielectric layer by sputter deposition or vapor deposition and forming a second metallic conductive layer pattern by photolithography and etching technologies;

(c) forming a passivation layer by screen printing, and processing marking, polishing, and cutting to form a plurality of chips;

(d) forming an appropriate shape of a glass substrate used in the thick film passive component by a first cutting and a second cutting;

(e) coating an adhesive on the surface of the glass substrate;

(f) adhering the chips onto the surface of the glass substrate which is coated with the adhesive under an appropriate temperature and pressure;

(g) packaging by the method of thick film packaging, comprising the steps of
  (g-1) forming terminations and drying same;
  (g-2) electroplating the electrode;
  (g-3) testing the electrical characteristics of the formed integrated RC component; and
  (g-4) packaging all the obtained RC components.

6. A packaging method of thin film passive components on silicon chip as set forth in claim 5, wherein after the formation of said second metallic conductive layer, said plurality of chips are annealed to eliminate the stress therein; laser trimming technology is used to trim resistance value; and electrical properties of the resistors and capacitors of said plurality of chips are measured.

7. A packaging method of thin film passive components on silicon chip as set forth in claim 5, wherein said glass substrate includes common glass or quartz glass materials.

8. A packaging method of thin film passive components on silicon chip as set forth in claim 5, wherein said adhesive is an insulative thermal-conductive material containing epoxy, and the method of coating is selected from printing, dot-gluing or transfer printing.

* * * * *